United States Patent [19]

Honma et al.

[11] Patent Number: 4,642,486
[45] Date of Patent: Feb. 10, 1987

[54] DECODER CIRCUIT USING TRANSISTORS OR DIODES OF DIFFERENT CHARACTERISTICS

[75] Inventors: Noriyuki Honma, Kokubunji; Hiroaki Nambu, Hachioji; Isao Yoshida, Nishitama; Hisayuki Higuchi, Kokubunji; Kunihiko Yamaguchi, Sayama, all of Japan

[73] Assignee: Hitachi, Ltd., Tokyo, Japan

[21] Appl. No.: 686,660

[22] Filed: Dec. 27, 1984

[30] Foreign Application Priority Data

Dec. 28, 1983 [JP] Japan .................. 58-246935

[51] Int. Cl.⁴ ............... H03K 19/013; H03K 19/082; H03K 19/092; G11C 8/00
[52] U.S. Cl. ................... 307/463; 307/443; 307/446; 307/475; 365/230
[58] Field of Search ............. 307/443, 446, 456–458, 307/463, 475; 365/189, 230

[56] References Cited

U.S. PATENT DOCUMENTS 4,349,895  9/1982  Isogai ................................. 365/230
4,385,370  5/1983  Isogai ................................. 365/230
4,400,635  8/1983  Mazgy ........................... 307/458 X

FOREIGN PATENT DOCUMENTS 97347   8/1978  Japan ................................. 307/463
146680  11/1980  Japan ................................. 307/463

OTHER PUBLICATIONS

Marcello et al, "Decode Circuit with Up-Level Clamp"; IBM Tech. Discl. Bull.; vol. 20, No. 11A, pp. 4406–4408, 4/1978.

Primary Examiner—Larry N. Anagnos
Attorney, Agent, or Firm—Antonelli, Terry & Wands

[57] ABSTRACT

This invention is effective in the speeding up of a decoder circuit and maintenance of output amplitude. The invention is characterized in that, in a decoder circuit composed of a multi-emitter transistor or at least one diode group in which the anodes of a plurality of diodes are connected, and a charge circuit having an output emitter follower transistor, the multi-emitter transistor or the forward voltage of the diodes are larger than the voltage between the base and the emitter of the output emitter follower transistor.

8 Claims, 9 Drawing Figures

DECODER CIRCUIT USING TRANSISTORS OR DIODES OF DIFFERENT CHARACTERISTICS

BACKGROUND OF THE INVENTION

This invention relates to an integrated circuit, and more particularly to a decoder circuit for a semiconductor memory.

High-speed decoder circuits using transistors or diodes are already known, and are actually used in LSI circuits for memory. For example, a decoder circuit in which transistors are connected as diodes is described on pages 78–79 of the article "Ultra High Speed 1K-Bit RAM with 7.5 ns Access Time" by H. Mukai and K. Kawarada (IEEE International Solid-State Circuits Conference 1977). Such a decoder circuit in the prior art is shown in FIG. 1. This decoder circuit essentially consists of a decoder transistor $Q_D$ and a current switch which is composed of transistors $Q_{s1}$ and $Q_{s2}$. In this current switch, current $I_s$ flows through either the transistor $Q_{s1}$ or $Q_{s2}$ depending on the voltage level of an input $V_{IN1}$. When all the current switch transistors which are connected to the emitters of a transistor $Q_D$ such as the transistor $Q_{s1}$ are off, the output $V_{out}$ becomes high. There is only one combination in which an off-transistor of the current switch is connected to all the emitters of the transistor $Q_D$, in the other transistors $Q_D$ at least one emitter being connected to an on-transistor. Therefore, current flows through a resistor $R_D$ to which $Q_D$ is connected and the outputs of the decoders become low-level.

The basic operation of the decoder circuit is such as described above. However, the decoder circuit which consists of current switches (they serve as current sources) ($Q_{S1}$, $Q_{S2}$ and $I_S$) and decoder transistors ($Q_D$) has two serious drawbacks. One is that the gray area for an address input is widened when an address is switched, because the current $I_S$'s flow from all the decoder transistors when the address input signal is in the transition region. (The transition region of the current switch consisting of transistors $Q_{S1}$ and $Q_{S2}$ appears to be about two times wider than that of the ordinary current switch.) Another drawback is that since, the decoder line $\overline{V}_{IN1}$ is charged only through the $R_D$ of the selected decoder (high level), the decoder output rises very slowly. (On the other hand the decoder output falls very fast because current $I_S$—in the steady state flows into it from many transistors $Q_D$—flows from one decoder transistor $Q_D$ which is at a high level).

A means for solving these problems is a current switch circuit CS, which is composed of transistors $Q_{C1}$, $Q_{C2}$, $Q_{E1}$ and $Q_{E2}$.

This art is disclosed in Japanese Patent Laid-Open No. 97347/1978. This is also shown in FIG. 1.

The use of this current circuit CS can remove the above drawbacks because the decoder line $\overline{V}_{IN1}$ or the like is charged by the emitter followers and the decoder output rises very fast.

However, the circuit in FIG. 1 still has a drawback. This is caused by the fact that the structures of the emitter follower transistors $Q_{E1}$, $Q_{E2}$ and the decoder transistor $Q_D$ have approximately the same characteristics, and thus their forward voltages between the bases and the emitters are approximately the same. That is, even if an emitter follower transistor $Q_{E1}$ or $Q_{E2}$ makes the decoder line $\overline{V}_{IN1}$ high, the decoder transistor $Q_D$ cannot be completely off, and some part of the current $I_L$ flows from the decoder transistor $Q_D$. The selection level of the decoder is essentially determined when all the decoder transistors $Q_D$ are completely off, but if current $I_L$ flows from all the decoder transistors $Q_D$, the selection level (high level) of the decoder is lowered considerably. In this case, the following problems are brought about:

1. The selection level varies depending on the variation of hFE and $V_{BE}$.
2. As the selection level (high level) is lowered, the low level must be lowered in correspondence therewith to obtain a required output amplitude. When the power consumption is constant (current $I_S$ is constant), $R_D$ should be increased in order to enlarge the amplitude, whereby the delay time becomes large.
3. Since the high and low levels at the decoder output are both reduced, the voltage margin of the current switches of the decoder circuit (and the sense circuit (not shown)) is substantially reduced.
4. Since the high level of the decoder line is not completely determined by the emitter follower, the threshold characteristic of the address buffer is deteriorated (the gray area is widened).

SUMMARY OF THE INVENTION

It is an object of the invention to obtain a decoder circuit which can be operated at an extremely high speed.

It is another object of the invention to obtain a decoder circuit in which the degree of variation of the selection level is extremely low.

It is a further object of the invention to obtain a decoder circuit in which the selection level is sufficiently high and the delay time is short.

To this end, this invention provides a decoder circuit which does not cause current to flow undesirably from transistor $Q_D$ of a selection decoder when a decoder line is at a high level.

In order to prevent the undesirable current flow, the voltage of the power source to which the load resistance of the decoder is connected should be made lower than $V_{CC}$. For example, if the voltage supplied to $R_D$ is lowered by 60 mV, the current which flows through $Q_D$ when the decoder line is at a high level is reduced to 1/10. If it is lowered by 120 mV, the current is reduced to 1/100. However, if the voltage applied to $R_D$ is lowered, the driving voltage of the memory cell array is also lowered, which reduces the noise margin of the current source circuit and the sense circuit for the memory cell.

To eliminate the above drawback, the forward voltage between the base and the emitter $V_{BE}$ of the decoder transistor $Q_D$ should be made larger than the forward voltages $V_{BE}$ of the transistors $Q_{E1}$, $Q_{E2}$. If the difference between those $V_{BES}$ is about 30 mV, the current which flows through $Q_D$ when the decoder line is at a high level can be reduced to approximately one half and if the difference is about 60 mV the current can be reduced to one tenth.

DETAILED DESCRIPTION OF THE INVENTION

EXAMPLE 1

Hereinunder, a first embodiment of the invention will be described in detail. There are generally two methods of reducing the forward voltages between the base and the emitter of $Q_{E1}$ and $Q_{E2}$. One is by making the emitter areas of $Q_{E1}$ and $Q_{E2}$ larger than that of $Q_D$, and another is by making the total amount of the impurities (Gummer number) of the intrinsic base region of $Q_D$ larger than those of $Q_{E1}$ and $Q_{E2}$. The former can be executed by determining the size of photomask and the latter by diffusing or implanting more impurities to $Q_D$ than to $Q_{E1}$ and $Q_{E2}$. (The diffusion depth of the emitter may be made shallower but controlling the base is generally easier.) In fact both methods should be used jointly so as to make the forward voltage difference larger.

Figure 2:
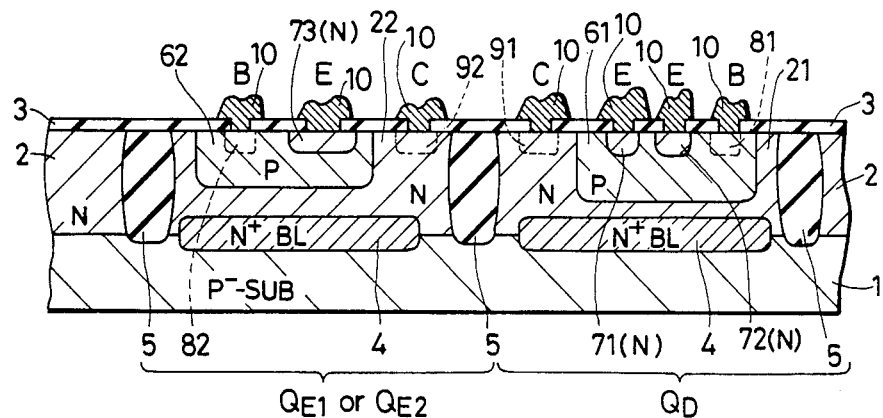
FIG. 2 is a sectional view of an embodiment of the invention.
Figure 3:
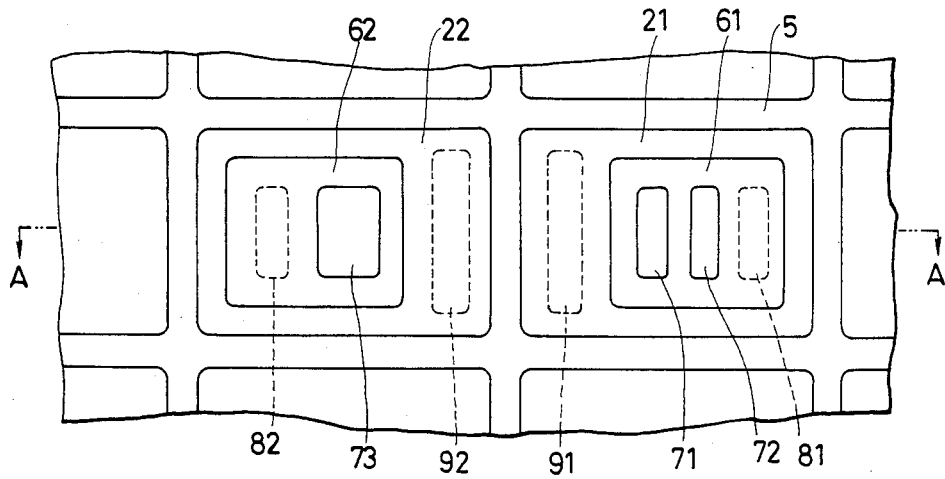
FIG. 3 is a plan view of the embodiment of the invention.

FIGS. 2 and 3 show the first embodiment of the invention. FIG. 2 is a sectional view taken along the line A—A of FIG. 3. By way of simplification, in both Figures, only a transistor $Q_{E1}$ or $Q_{E2}$ and a decoder transistor $Q_D$ with two emitters are shown.

FIG. 3 is a plan view of the embodiment shown in FIG. 2 with an insulator 3 removed and seen from above.

The solid lines show PN junctions, and the broken lines show the same impurity ranges where impurity concentrations are different.

The structure of FIG. 2 will be first explained.

On a $1 \times 10^{15}$ cm$^{-3}$ P type semiconductor substrate 1 a $1 \times 10^{20}$ cm$^{-3}$ n+ buried layer 4 is provided, and epitaxial layers 2, 21, 22 are grown 1 $\mu$m thick. Then, after an isolation region 5 (insulator) is formed, base regions 61, 62 are formed by a diffusion or ion implantation method. Their depths are about 0.3 $\mu$m and 0.4 $\mu$m, respectively. At this time, as described above, the impurity concentration of the region 61 has been made higher than that of the region 62, whereby the sheet resistivity of the base regions have become 600 $\Omega/\square$, 1K$\Omega/\square$ and respectively. Emitter regions 71, 72, 73 are formed with a depth of 0.2 $\mu$m by a similar method as the base regions. The impurity concentration is set to be $1 \times 10^{21}$ cm$^{-3}$. At this time, the area of the emitter 73 has been made larger than those of the emitters 71, 72. In this embodiment, as is shown in FIG. 2, it is about twice as large as those of the emitters 71, 72, but it can be about ten times or more if necessary. FIG. 3 will make this clear.

Next, insulator 3 is formed on the entire surface, and on desired portions contact holes are formed where metallizations 10 of aluminum, silicide metal or the like are provided.

It is then completed by providing passivation film on the entire surface.

Figure 1:
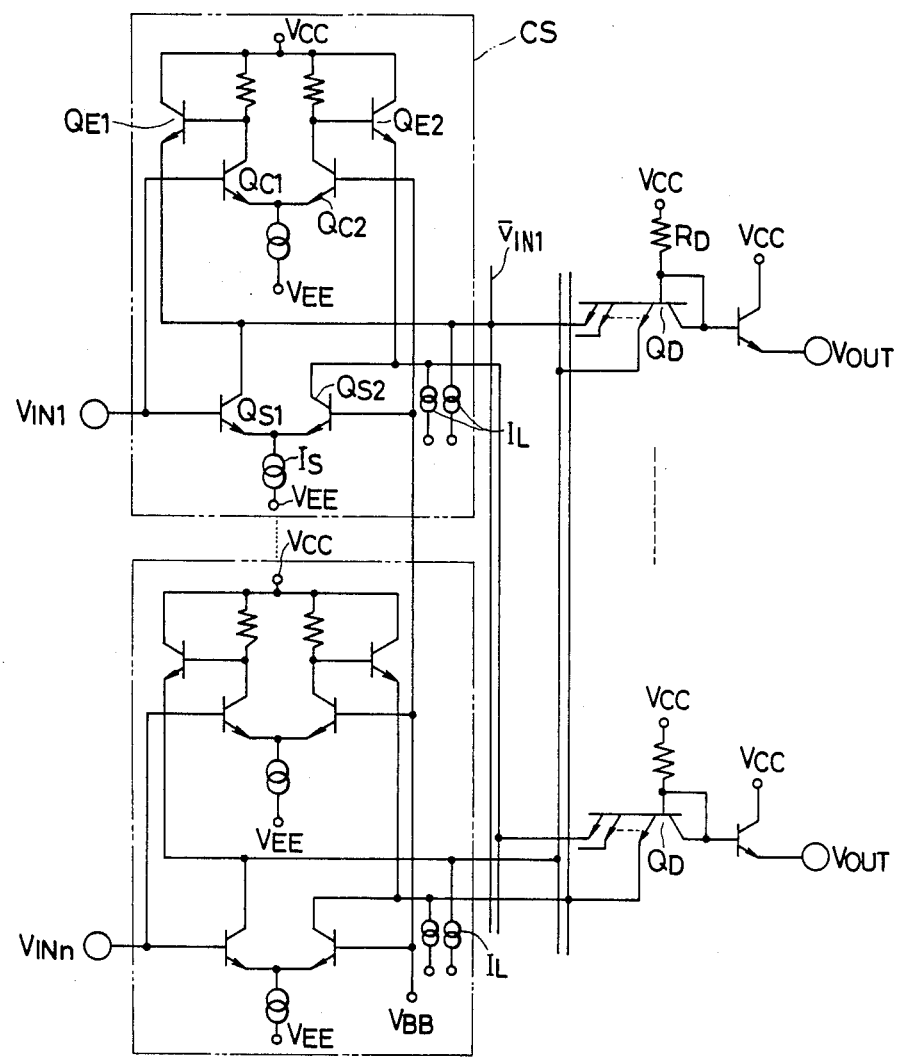
FIG. 1 is a circuit diagram showing a conventional decoder.

By constructing the circuit shown in FIG. 1 by using the above elements of FIGS. 2 and 3, a high-speed decoder circuit is obtained.

EXAMPLE 2

A second embodiment of the invention will be described in the following.

Figure 4:
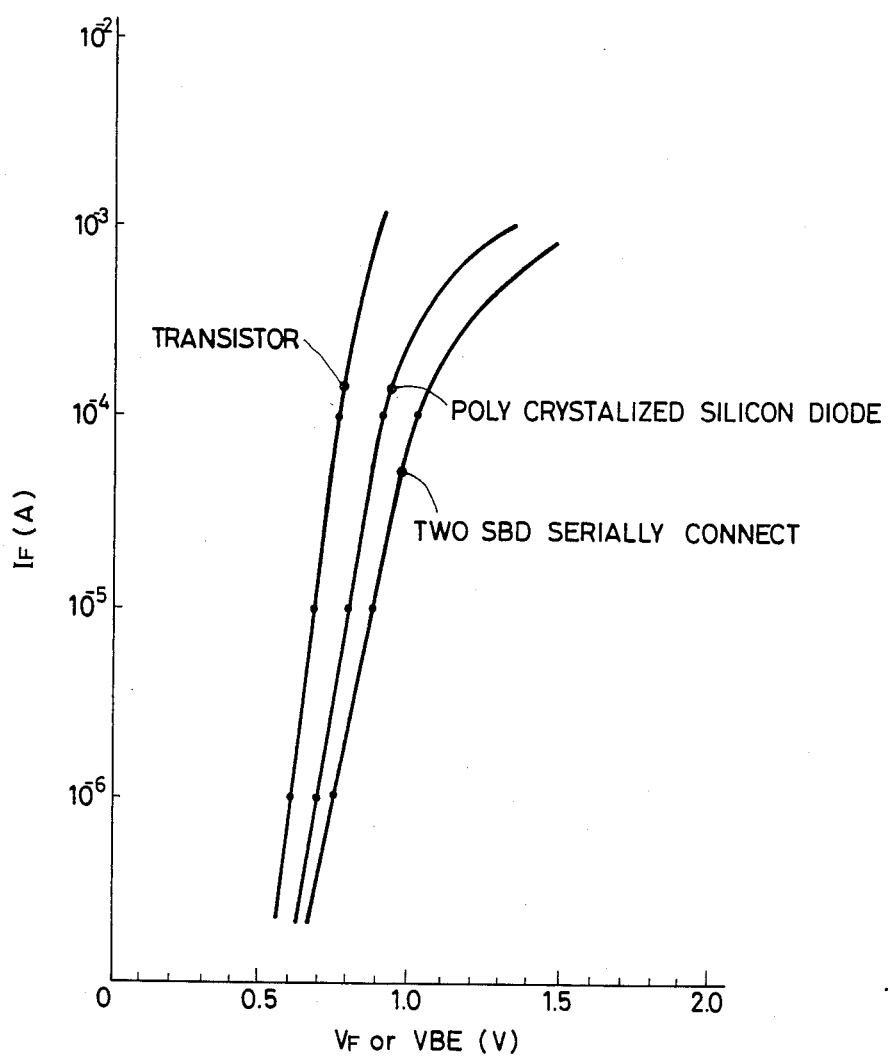
FIG. 4 is a graph showing the I-V characteristics of a diode, an SBD and a transistor.

Another method for making a difference between the $V_{BE}$ of $Q_{E1}$, $Q_{E2}$ and the $V_{BE}$ of $Q_D$ is using, in place of a transistor, a diode which has a structure different from a transistor. In other words, if its forward voltage drop $V_F$ is larger than the forward voltages $V_{BE}$ between the base and the emitter of $Q_{E1}$, $Q_{E2}$, the effects of the invention can be obtained. There are various diodes used as such diodes, but it is preferable in terms of speeding up a decoder circuit that the stray capacitance on the anode side of a diode be small. FIG. 4 shows the measured I-V characteristics of a diode having such preferable characteristics. One is a diode composed of polycrystalline silicon of an insulating film and, as is shown in FIG. 4, its $V_F$ is more than 100 mV larger than the $V_{BE}$ of the transistor. Since this diode is formed on the insulating film, the stray capacitance is small, and since, the recovery of saturation is fast because of the recombination of carriers, it is suitable for a high-speed circuit.

Figure 5A:
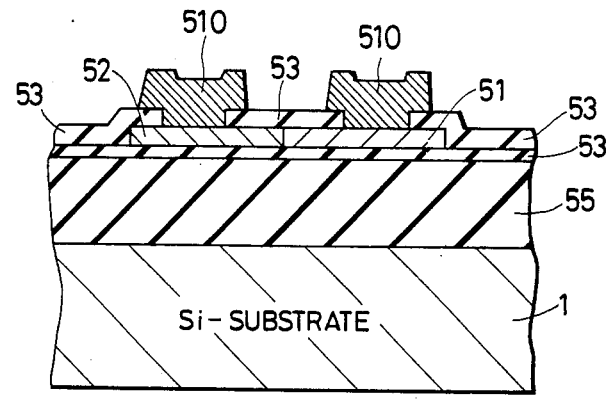
FIGS. 5A, 5B are sectional views of diodes composed of polycrystalline silicon on insulating film.

This type of diode is shown in FIG. 5A. The diode in FIG. 5A is formed between a p-type (or n-type) poly-Si 52 and an n-type (or p-type) poly-Si 51. In the Figure, the impurity concentration of the p-type poly-Si 52 is $2 \times 10^{19}$ cm$^{-3}$ and the thickness is 0.5 $\mu$m, and the impurity concentration of the n-type poly-Si 51 is $1 \times 10^{20}$ cm$^{-3}$.

Figure 5B:
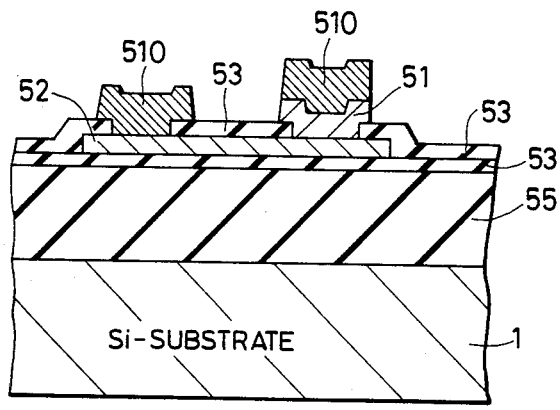

In FIG. 5B, a diode is formed between a p-type (or n-type) poly-Si 52 and an n-type (or p-type) poly-Si 51. In the Figure, the impurity concentration of the p-type poly-Si 52 is $2 \times 10^{19}$ cm$^{-3}$ and its thickness is 0.5 $\mu$m, and the impurity concentration of the n-type poly-Si 51 is $1 \times 10^{20}$ cm$^{-3}$ the thickness of 51 is 0.5 $\mu$m. Generally, the diode shown in FIG. 5B is preferably because a large junction area is easily obtained, but from the viewpoint of the manufacturing process the diode shown in FIG. 5A can be manufactured more easily.

Both the diodes in FIGS. 5A and 5B are formed on field oxidation 55 in order to reduce the stray capacitance. However, a poly-Si diode may be formed on a device such as a transistor or a resistor, if it is convenient in terms of layout, in spite of the increase in the stray capacitance.

The reference numeral 510 denotes an aluminum electrode and 53 an insulator.

Figure 6:
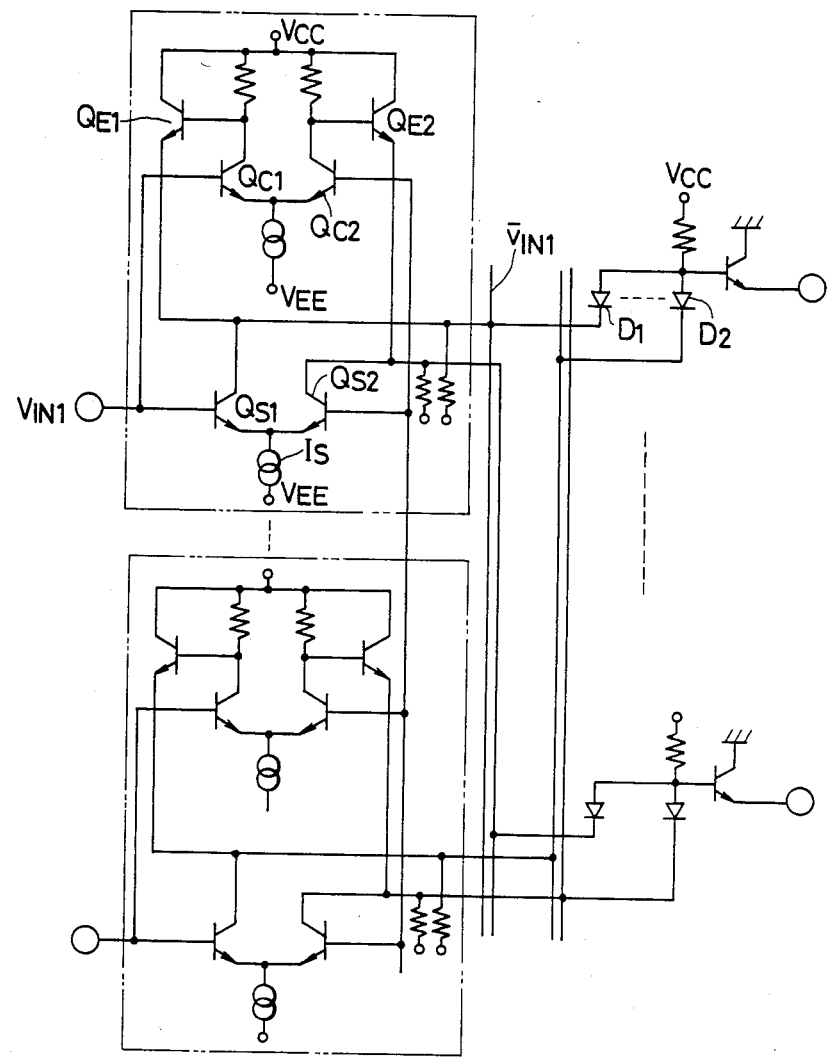
FIG. 6 is a circuit diagram of another embodiment of the invention composed of diodes.

FIG. 6 shows a decoder circuit composed of diodes $D_1$, $D_2$ which have large $V_{Fs}$, such as polycrystalline silicon diodes.

As described above, by designing the diode such that the forward voltage drop of the diode is larger than the $V_{BE}$ of the emitter follower transistor, there is no current which flows from the selected decoder circuit through the diode and thus there is no decrease of amplitude caused by useless current, whereby a high-speed decoder circuit can be composed. Furthermore, since, as is obvious from the sectional view in FIG. 5, the stray capacitance accompanying the poly-Si diode is very small, the high speed efficiency can be heightened all the more.

EXAMPLE 3

Another diode in which the stray capacitance is small is a Schottky barrier diode (SBD). In a single Schottky barrier diode, its forward voltage drop $V_F$ is smaller than the forward voltage between the base and the emitter $V_{BE}$ of a transistor. However, since the forward drop $V_F$ can be set easily to an appropriate value by appropriately selecting the Schottky metal the impurity concentration of the semiconductor, such an appropriate value can be obtained by connecting a plurality of Schottky barrier diodes serially. FIG. 4 shows that the forward voltage drop $V_F$ of two serially connected SBDs is more than 120 mV larger than the forward voltage between the base and the emitter $V_{BE}$ of a transistor. This SBD, in which the stray capacitance on the anode side is only between the metallization and the substrate of the semiconductor, in which its value is very small and in which no minority carrier stores, can make up a very high-speed decoder circuit.

Figure 7:
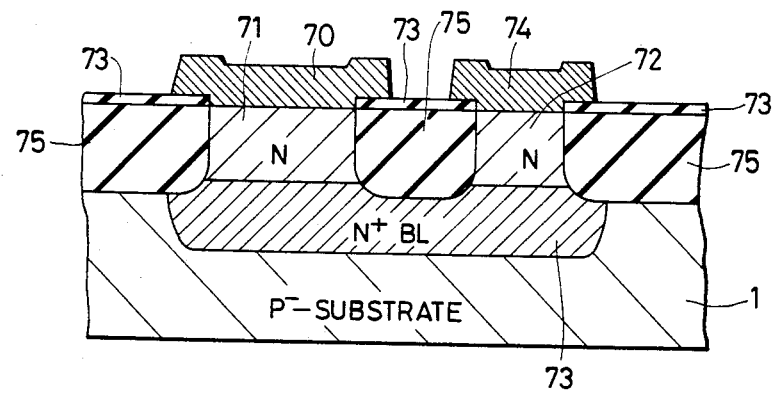
FIG. 7 is a sectional view of an SBD.

FIG. 7 shows this kind of Schottky barrier diode (SBD). The SBD is formed between an electrode 70 and an n-type silicone 71. Metal such as aluminum (Al) or silicide for example platinum silicide (PtSi) may be used for the electrode for the SBD. In the case of using silicide, it is disposed between metal and silicon. The forward voltage of the SBD can be changed according to needs by changing the material for the electrode, the impurity concentration of the n-type region or the area of the SBD.

In FIG. 7, the impurity concentration of the substrate 1 is $1 \times 10^{15}$ cm$^{-3}$, the impurity concentration of the n+ buried layer 73 is $1 \times 10^{20}$ cm$^{-3}$ and the impurity concentration of $1 \times 10^{13}$ cm$^{-2}$ was implanted into the n-type region 71. The impurity concentration of the n-type region 72 is $1 \times 10^{19}$ cm$^{-3}$ and the thickness was 1 μm.

Figure 8:
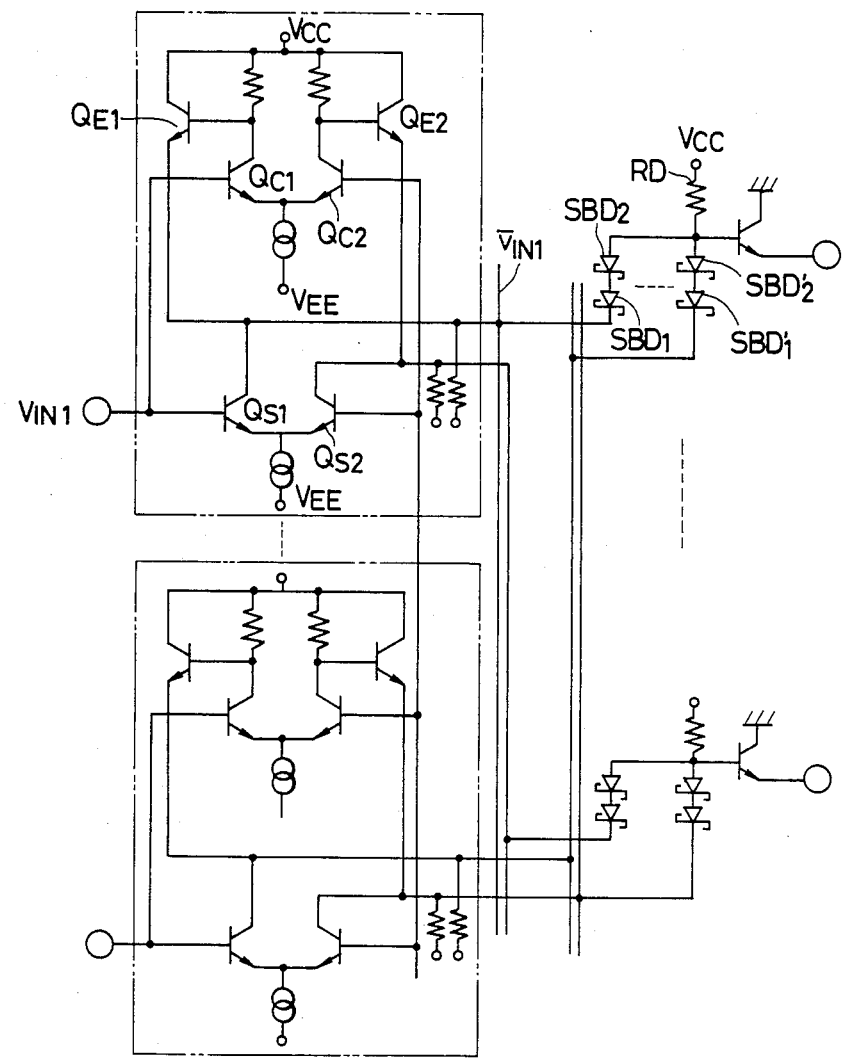
FIG. 8 is a circuit diagram of another embodiment of the invention composed of SBDs.

FIG. 8, shows an embodiment of a decoder circuit in which two serially connected Schottky barrier diodes SBD1 and SBD2 are used. It goes without saying that more than three diodes may be serially connected, depending on a particular design.

The forward voltage of each SBD is designed such that the forward voltage of the desired value can be obtained when at least two of them are serially connected.

In an SBD, the parasitic capacitance of the anode (electrode) is small, as is obvious form FIG. 7, and the capacitance accompanying the SBD barrier can be reduced by appropriately designing the impurity concentration of the n+ region 71. Accordingly, a very high-speed decoder circuit can be designed by using SBDs.

What is claimed is:

1. A decoder circuit composed of at least one current switch means which provides current to either one of two output terminals in response to an input signal applied to an input terminal of said at least one current switch means, a charging circuit means including output emitter follower transistors for pulling up the signal level of said output terminals, and at least one multi-emitter transistor with its base and collector being commonly connected to form a junction, emitters of which are connected to the corresponding output terminals of said current switch means and said charging circuit means, wherein the improvement comprises:

the output emitter follower and multi-emitter transistors being structurally designed so that the voltage across the base and the emitter regions of said at least one multi-emitter transistor is larger than the voltage across the base and the emitter regions of each of said emitter follower transistors.

2. A decoder circuit according to claim 1, wherein the emitter area of said emitter follower transistor is larger than the emitter area of said multi-emitter transistor.

3. A decoder circuit according to claim 1, wherein the total amount of the impurities of the intrinsic base region of said multi-emitter transistor is larger than the total amount of the impurities of said emitter follower transistor.

4. A decoder circuit according to claim 1, wherein one of said output terminals will have a positive voltage level when current is applied to it and the other of said output terminals will have a negative voltage level when current is applied to it.

5. A decoder circuit composed of at least one current switch means which provides current to either one of two output terminals in response to an input signal applied to an input terminal of said at least one current switch means, a charging circuit means including output emitter follower transistors for pulling up the signal level of said output terminals, and at least one diode group in which the anodes of a plurality of diodes are commonly connected and the cathode terminals of said diodes are connected to the corresponding output terminals of said current switch means and said charging circuit means, wherein the improvement comprises:

the forward threshold voltages of said diodes being larger than the voltage across the base and emitter regions of said emitter follower transistor.

6. A decoder circuit according to claim 5, wherein said diodes are composed of polycrystalline silicon.

7. A decoder circuit according to claim 5, wherein said diodes are a plurality of connected Schottky barrier diodes wherein each of said diode forward threshold voltages comprises the forward voltages of at least two serially-connected Schottky barrier diodes.

8. A decoder circuit according to claim 5, wherein one of said output terminals will have a positive voltage level when current is applied to it and the other of said output terminals will have a negative voltage level when current is applied to it.

* * * * *